United States Patent [19]
Gibson et al.

[11] Patent Number: 6,161,916
[45] Date of Patent: Dec. 19, 2000

[54] MEMORY EXPANSION CIRCUIT FOR INK JET PRINT HEAD IDENTIFICATION CIRCUIT

[75] Inventors: Bruce David Gibson, Lexington; George Keith Parish, Winchester, both of Ky.

[73] Assignee: Lexmark International, Inc., Lexington, Ky.

[21] Appl. No.: 09/396,237

[22] Filed: Sep. 15, 1999

Related U.S. Application Data

[60] Division of application No. 09/021,633, Feb. 10, 1998, Pat. No. 6,022,094, which is a continuation-in-part of application No. 08/534,674, Sep. 27, 1995, Pat. No. 5,940,095.

[51] Int. Cl.[7] .......................... B41J 29/393; B41J 29/38
[52] U.S. Cl. ............................................. 347/19; 347/14
[58] Field of Search ................................ 347/19, 14, 59, 347/237

[56] References Cited

U.S. PATENT DOCUMENTS

| | | | |
|---|---|---|---|
| 3,417,373 | 12/1968 | Lampkin, Jr. .......................... | 711/166 |
| 4,872,027 | 10/1989 | Burkisk et al. ........................ | 347/19 |
| 5,033,887 | 7/1991 | Bauerle .................................. | 400/175 |
| 5,363,134 | 11/1994 | Barberhenn et al. ................... | 347/49 |
| 5,585,836 | 12/1996 | Pham et al. ............................ | 347/237 |

*Primary Examiner*—Thinh Nguyen
*Attorney, Agent, or Firm*—Andrew S. Neely; D. Brent Lambert

[57] ABSTRACT

An ink jet print head identification system for providing print head identifying information to the electronics of an ink jet printer includes one or more parallel load, serial out, dynamic shift registers integrated into a print head chip having a plurality of address lines interconnecting the printer electronics and the print head electronics. The memory input of each shift register is electrically connected to a memory matrix that supplies digital bits of information to the shift register in response to receiving a decode signal function from the printer electronics. In a preferred embodiment, two of the address lines provide each of the registers with successive sequential clock signals to serially shift the bit of information received from the shift register's corresponding memory matrix to an output line where the print head identifying information is read by the printer electronics. Embodiments of the invention may employ any number of shift registers and memory matrices independent of the number of available address lines.

4 Claims, 4 Drawing Sheets

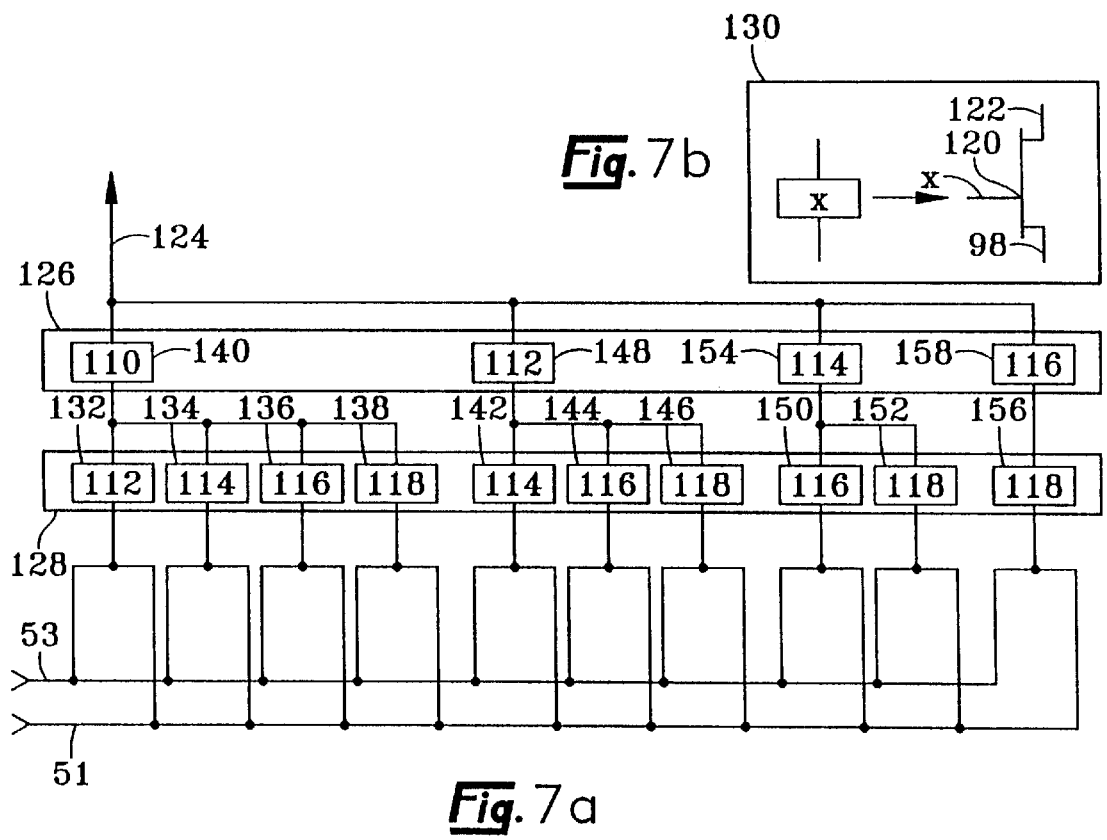
Fig. 7b
Fig. 7a
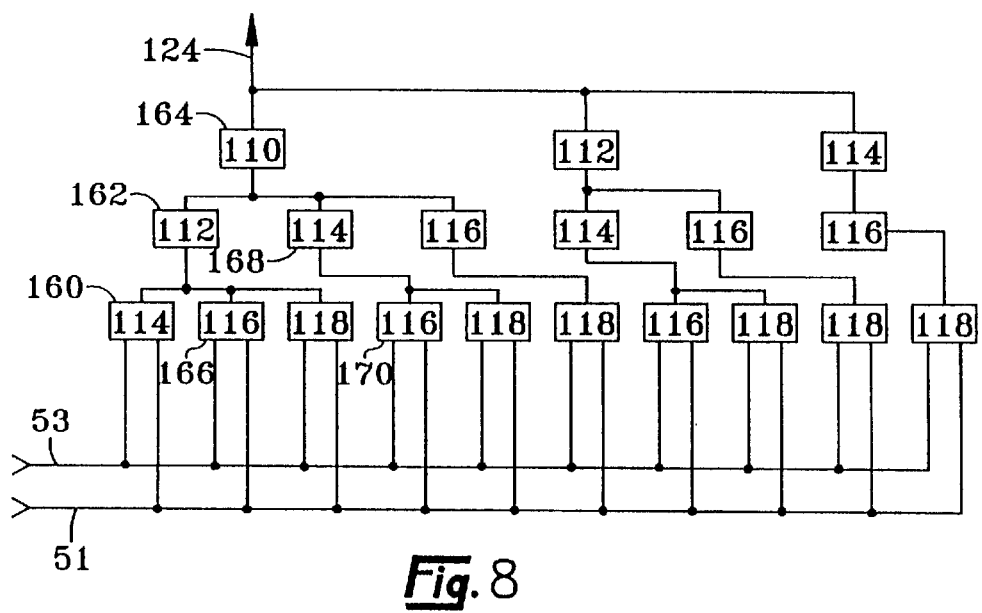
Fig. 8

MEMORY EXPANSION CIRCUIT FOR INK JET PRINT HEAD IDENTIFICATION CIRCUIT

TECHNICAL FIELD

This is a division U.S. patent application Ser. No. 09/021,633, filed Feb. 10, 1998 now of U.S. Pat. No. 6,022,094, entitled MEMORY EXPANSION CIRCUIT FOR INK JET PRINT HEAD IDENTIFICATION CIRCUIT, which is a continuation-in-part of U.S. patent application Ser. No. 08/534,674 filed Sep. 27, 1995, now U.S. Pat. No. 5,940,095, and entitled INK JET PRINT HEAD IDENTIFICATION CIRCUIT WITH SERIAL OUT, DYNAMIC SHIFT REGISTERS.

The present invention relates to an ink jet print head identification circuit that employs shift registers for serially transmitting print head identification information to the ink jet printer electronics. More particularly, it relates to a print head identification circuit which employs an array of transistors or other electronic switches to provide a matrix of programmable bits to each of a predetermined number of shift registers.

BACKGROUND OF THE INVENTION

Ink jet type printers employ a printing head that consists of a series of nozzles, or orifices positioned in an orifice plate for expelling ink onto a printing surface. The ink can be expelled by a variety of means, including continuous, piezoelectric, and thermal/bubble jet. While several different ink jet technologies have evolved over the past two decades, the most popular ink jet technology today is the bubble jet where ink within a chamber is locally superheated to form an expanding bubble which propels a drop of ink through an orifice and onto the printing surface. Piezoelectric printers function in a similar manner inasmuch as ink is expelled through an orifice. However, instead of boiling the ink in a chamber, the ink is essentially squeezed from the chamber as a result of deflections/expansions generated by a piezoelectric ceramic transducer. The ceramic transducer changes its physical dimensions when subjected to an electric field, thereby generating a pressure wave within the ink chamber and expelling an amount of ink through the chamber orifice. Both piezoelectric and bubble-jet methodologies are considered "drop-on-demand" or "impulse" technologies, i.e., a drop of ink is ejected from the print head only when desired.

Each type of ink jet print technology requires its own unique type of print head, and print heads may further vary based on parameters such as whether the print head contains only black ink, or whether it is capable of color printing. Generally, the different types of print heads are interchangeable, except that most printers are unable to accommodate both black ink and color due to physical differences between the print heads, i.e., print heads designed for color printing are typically larger to accommodate a variety of ink colors. Other print head parameters include architecture, resolution, number of ink jet nozzles, and spacing between the nozzles. Because print heads are interchangeable, the printer electronics must know what particular type of print head is installed, as well as information relating to the various print head parameters, so that algorithms within the printer control system can be reconfigured to provide appropriately formatted print commands to the print head electronics.

Therefore, it is desirable to provide the printer electronics with information relating to the characteristics of the particular print head that is installed. This can be done by digitally encoding the identifying information into the print head electronics and enabling the printer electronics to retrieve that information as it is needed.

A number of attempts have been made in the prior art to provide print head identifying information to the printer electronics. U.S. Pat. No. 4,872,027 to Buskirk et al. discloses providing extra electrical contact pads on the resistor network/array which fires the nozzles of the print head. These contact pads are selectively electrically connected in the resistor network to fire the individual nozzles in one of several unique configurations, each of which defines a specific print head. The code provided by these unique configurations of the electrical pads is detectable by the printer so that the type of head installed is determinable. This is accomplished by selectively connecting the individual electrical pads (or not connecting them) to the resistor circuits or circuit traces. By individually toggling the resistor lines at high or low voltage levels and detecting a voltage level shift on the lines associated with the extra contact pads, a connection (or lack thereof) may be detected.

Other prior art approaches to providing print head identifying information to the printer disclose identification circuitry disposed in the print head. U.S. Pat. No. 4,930,915 to Kikuchi et al. discloses print head identification means disposed in a print head. In one embodiment, a 24-pin print head is identified when the printer electronics read a "high" state value on a signal line interconnecting the printer electronics and identification means. A 9-pin print head is identified by a "low" state signal. In another embodiment of the Kikuchi invention, a parallel-serial converter produces a predetermined identification signal.

U.S. Pat. No. 5,363,134 to Barbehenn et al. discloses an integrated circuit for use in the print head of an ink jet printer. The integrated circuit includes an array circuit having a plurality of resistor cells arranged into rows and columns for heating an ink reservoir to produce a pattern of ink jets. A corresponding number of row and column lines are coupled to the array circuit for selecting and energizing the resistor cells according to the desired print pattern. An identification circuit is integrated into the same substrate as the array circuit. The identification circuit is programmable by means of a plurality of programmable paths corresponding and coupled to each row line. These programmable paths each include a programmable fuse and an active device connected in series. The opposite ends of the programmable paths are coupled together at a common node, which in turn is coupled to an output circuit for providing a single serial output signal in response to a sequential polling of the row lines.

The number of bits of identifying information that Barbehenn is capable of providing to the printer electronics is limited to the number of row lines available. For example, if there are a total of seven row lines interconnecting the array circuit with the printer electronics, then Barbehenn's identification circuit will be limited to storing seven and only seven bits of identifying information because each of the programmable paths correspond with and are coupled to a unique one of the row lines. To provide an identification circuit that contains greater than seven bits of identifying information, Barbehenn would be required to increase the number of row lines, or address lines available.

In addition to being limited by the number of available address lines, the amount of information that can be stored on a print head cartridge is also limited by cost and space considerations. Because most print head cartridges are disposable, it is very desirable to minimize their costs.

Including large memory arrays on a print head chip increases the cost of fabricating the print head. Thus, while a large memory chip on the print head might be desirable from a memory standpoint, the additional cost of placing such a device on a disposable print head makes the solution economically undesirable. In addition, storing more information on the print head cartridge increases the space requirement for the memory circuit on the print head. As the size of the print head substrate increases, the cost and complexity correspondingly increase.

Thus, there is a need for an efficient, inexpensive, print head identification circuit that uses a minimum number of components to store a maximum amount of information and preferably is not limited by the number of address lines interconnecting the existing print head electronics and printer electronics.

SUMMARY OF THE INVENTION

The present invention discloses a memory device for storing and providing information. The invention includes an identification device for an ink jet print head. The device has printer electronics for communicating with the ink jet print head. A shift register loads in a plurality of print head information bits in response to a load signal and serially outputs the plurality of print head information bits in response to an output signal. A plurality of memory matrices, each one electrically connected to a corresponding memory input of the shift register, stores print head information bits and provides the print head information bits to the corresponding memory input of the shift register in response to a decode signal function being sent from the printer electronics. A plurality of address lines transmit the decode signal function from the printer electronics to the memory matrix and transmit the clock and load signals from the printer electronics to the shift register.

The above described invention improves the prior art by allowing the amount of information storable on a print head cartridge to be increased without increasing the number of address lines. In addition, by connecting a memory matrix to the memory inputs of the shift register, the number of information bits storable is dramatically increased while the number of transistors needed to construct the memory device increases only marginally. The decode signal function allows the printer electronics to send a series of predetermined digital words to the print head and receive another series of digital words describing the print head cartridge. Thus, the present invention provides an inexpensive device that allows a dramatic increase in the information a print head can store and provide to a printer without a correspondingly dramatic increase in the complexity of the print head electronics.

In a preferred embodiment of the present invention each memory matrix has a first level containing a plurality of transistors. Each transistor has a source, a drain and a gate. The gate of each transistor is electrically connected to a corresponding address line of the plurality of address lines. The source of each transistor is electrically connected to the memory input of a shift register corresponding to the particular memory matrix. The drain is electrically connected to either a first voltage potential representing a logic one or a second voltage potential representing a logic zero. The transistors function as electronic switches with a first terminal, a second terminal, and a switch input. When a sufficiently high voltage is applied to the switch input, the electronic switch is closed and the first terminal is electrically connected to the second terminal. When no voltage is applied to the switch input, the electronic switch is open and the first and second terminals are not electrically connected. While transistors are discussed in the majority of the application, it is to be understood that any similarly functioning switch could be used.

In another embodiment, the memory matrix has a first level containing a plurality of transistors each having a source, a drain and a gate. The gate of each transistor is electrically connected to a corresponding address line of a plurality of address lines. The source of each transistor is electrically connected to the drain of one of a second plurality of transistors. The drain is electrically connected to either a first voltage potential representing a logic one or a second voltage potential representing a logic zero. A second level contains the second plurality of transistors each of which has a source, a drain and a gate wherein the gate of each of the second plurality of transistors is electrically connected to a corresponding address line of the plurality of address lines, the source of each of the second plurality of transistors is electrically connected to a corresponding memory input of the shift register, and the drain of each one of the transistors of the second plurality of transistors is electrically connected to the sources of a group of transistors in the first plurality of transistors. The connections are such that when any two address lines that are connected to the gates of the transistors in either level contain a logic one, a single current path is completed between the shift registers memory input and either the first or second voltage potential.

In another embodiment of the present invention, each memory matrix further comprises a plurality of transistors having a gate, a source, and a drain wherein the plurality of transistors are arranged in a number of levels consisting of a highest level, a lowest level and at least one intermediate level. The transistors of the levels are connected such that the transistors of the lowest level have their drains connected to either a first voltage potential representing a logic one or a second voltage potential representing a logic zero and their sources connected to the drains of a corresponding transistor on an intermediate level. In addition, the transistors of the highest level have their sources connected to the memory input of the shift register and their drains connected to the sources of a corresponding group of transistors of an intermediate level. The transistors of the intermediate level have their sources electrically connected to the drain of a corresponding transistor of a higher level and their drains connected to the sources of a corresponding group of transistors of a lower level.

In an especially preferred embodiment, the gates of the plurality of transistors are connected to the address lines such that when a number of the address lines equal to the number of levels contain a voltage potential sufficient to open the gates of the transistors to which it is connected, a single current path is completed between the shift register memory input corresponding to the memory matrix and either a first or second voltage potential. In yet another embodiment, the memory matrix has a plurality of transistors arranged in a number of levels. The decode signal function comprises a plurality of digital words such that each word contains a certain number of bits and a number of bits in the digital word equal to the number of levels must be active in order to select a bit of printer identification information from the memory matrix.

In an especially preferred embodiment, the decode signal function comprises a series of digital words, each word having a number of bits equal to "D". Each memory matrix consists of a plurality of transistors divided into a number of levels "L". In this embodiment, the number of print head information bits that can be stored in each of the plurality of memory matrices is given by the equation:

$$\frac{D!}{L!(D-L)!}$$

In addition, the number of transistors required to construct each memory matrix is given by the equation:

$$\frac{D!}{(L-1)!(D-L+1)!} + \frac{D!}{L!(D-L)!} - 1$$

The information storing and providing system of the present invention further includes a memory matrix for storing ink jet print head identification information and providing the identification information to the ink jet printer electronics. The memory matrix has a plurality of transistors that have a source, a drain, and a gate. The transistors are arranged in a plurality of levels. A plurality of print head address lines are connected to the gates of the transistors. A plurality of shift registers receive the print head identification information from the plurality of transistors in response to a decode signal function being received on the plurality of print head address lines. The shift registers serially transmit the print head information to the ink jet printer electronics. The drains of a first level of transistors are electrically connected to either a logical one or a logical zero. The sources of a last level of transistors are connected to the memory input of one of the plurality of shift registers. The gates of the transistors are attached to the print head address lines so as to minimize the number of transistors needed to construct a memory matrix capable of storing a given amount of print head identification information. The print head has a temperature sense circuit with an output line. The print head identification information is serially transmitted to the printer electronics on the output line of the temperature sense circuit.

In yet another preferred embodiment of the present invention, a memory device is provided for storing and outputting information. The device consist of a plurality of memory matrices. Each memory matrix contains a plurality of transistors that have a drain, a source, and a gate. The plurality of transistors are arranged in a plurality of levels that proceed from a lowest level to a highest level. A plurality of single bit shift registers produce a serial output. Each shift register has a memory input and an associated memory matrix. The memory input of each shift register is electrically connected to the sources of the transistors in the highest level of the shift register's associated memory matrix. A plurality of address lines receive a decode signal function, a load signal, and a clock signal. An output line transmits the serial output of the plurality of shift registers. The gate of each one of the plurality of transistors is electrically connected to one of the plurality of address lines. The drains of the transistors of the lowest level are either electrically connected to a voltage potential representing a logic one or a voltage potential representing a logic zero. The sources of the transistors of the lowest level are electrically connected to the drains of the transistors of the next highest level. The transistors of a level that has a level immediately above the level and a level immediately below the level have their sources electrically connected to the drains of the transistors of the level immediately above their level and their drains electrically connected to the sources of the transistors of a level immediately below their level.

BRIEF DESCRIPTION OF THE DRAWINGS

The preferred embodiments of the invention will now be described in further detail with reference to the drawings wherein like reference characters designate like or similar elements throughout the several drawings as follows:

FIG. 7a is a circuit diagram of a two level decode memory matrix;

FIG. 7b illustrates a transistor used in FIG. 7a; and

FIG. 8 is a circuit diagram of a three level decode memory matrix.

DETAILED DESCRIPTION OF THE INVENTION

Figure 1:
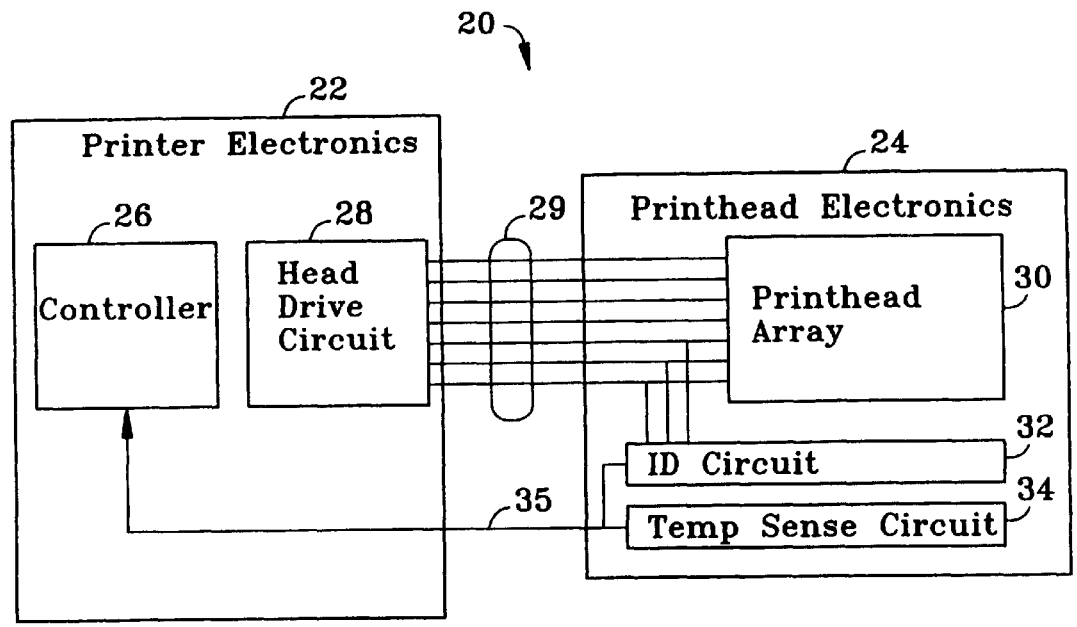
FIG. 1 is a block diagram of the print head identification system.

In accordance with a preferred embodiment of the present invention, there is shown in FIG. 1 a block diagram of an ink jet print head identification system 20 including ink jet printer electronics 22 and ink jet print head electronics 24. Typically, bubble jet print heads incorporate a resistor array, or print head array 30 for selectively boiling and expelling ink through orifices in an orifice plate (not shown) on the print head. Resistors within the array 30 are selectively energized through appropriate signals received from the printer electronics 22 on address lines 29. Within the printer electronics 22 a microprocessor controller 26, which is typically an ASIC controller providing TTL level outputs, sends print data commands to a head drive circuit 28. In a preferred embodiment, the drive circuit 28 is a TEXAS INSTRUMENTS 75373, 100 milliamp, push-pull driver.

Drive circuit 28 converts print data commands received from the controller 26 into appropriately formatted analog pulses which are demultiplexed and sequentially provided to the print head electronics 24 via address lines 29. These analog pulses possess sufficient intensity to heat the resistors within the print head array 30 so that ink within the print head boils to form a bubble, thereby expelling ink through an orifice. The number of address lines 29 available will vary depending on the particular printer that is used.

Because different styles and types of ink jet print heads requiring differently formatted analog pulses are interchangeable in ink jet printers, it is important for the printer electronics 22 to possess information relating to the print head that is installed in the printer. Print head parametric information is useful to the printer electronics 22 because it allows the printer electronics 22 to reconfigure print control algorithms to produce analog pulses that are appropriate for the specific print head installed. The present invention provides print head identifying information to the printer electronics 22 by encoding the information digitally in an identification (ID) circuit 32 that is integrated into the print head electronics 24 during fabrication.

Typically, print head electronics 24 are fabricated as a single integrated chip. In addition to the print head resistor array 30 and corresponding address line connections 29, the chip will normally incorporate a temperature sense circuit 34. The temperature sense circuit 34 is typically a metal resistor that senses the temperature of the print head during printing. The sensed temperature is provided as an analog signal to the printer controller 26 on output line 35, enabling the printer controller 26 to monitor the print head for overheat conditions.

To reduce I/O requirements, the ID circuit 32 of the present invention uses some, but not all, of the existing address lines 29 for receiving inputs from the printer electronics 22 and it uses the existing temperature sense output 35 to serially transmit the encoded print head identifying information to the printer electronics 22. A maximum of three address lines are used by the ID circuit 32 to receive inputs, and the number of encoded bits of information within the ID circuit 32 is independent of the number of address lines 29 used. There is minimal or no interference with the temperature sense output 35 during normal operation because the printer electronics 22 will read temperature sense only when the printer is idle.

Figure 2:
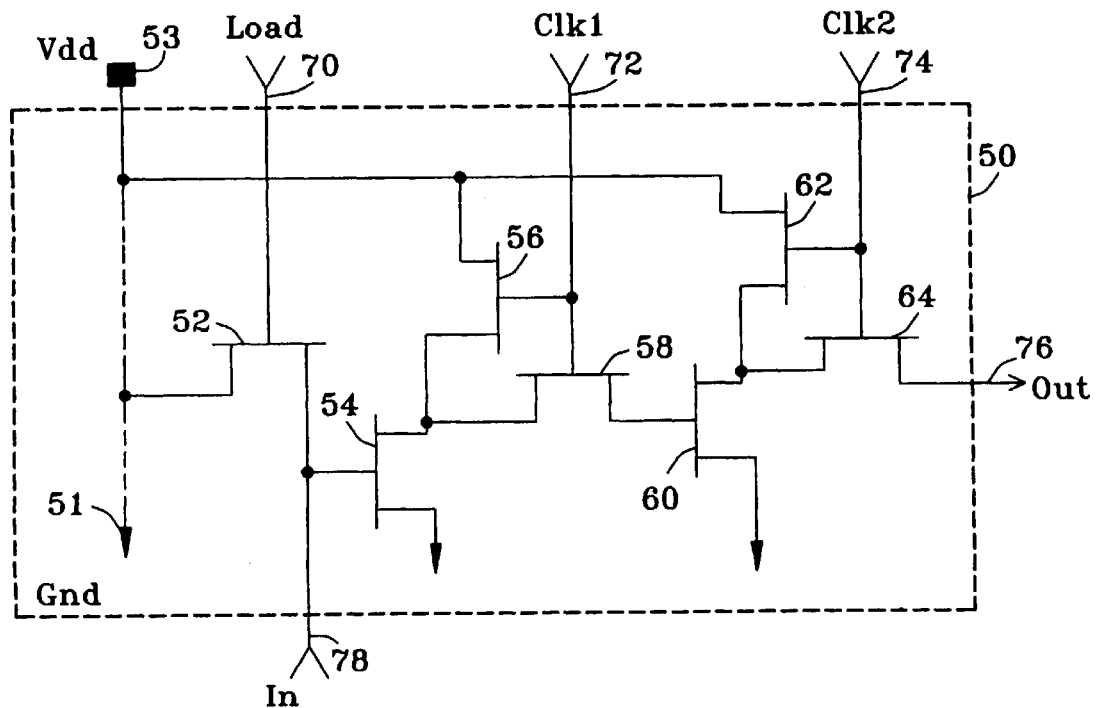
FIG. 2 is a circuit diagram of a one bit dynamic shift register.

In a preferred embodiment, print head identifying information is digitally encoded into the ID circuit 32 by means of one or more programmed, one bit dynamic shift registers 50 such as the one shown in FIG. 2. The shift register 50 is, for example, mask programmed during fabrication by either connecting the source of load transistor 52 to ground 51 to produce a logic "0" when the gate of load transistor 52 is made active by a load signal 70 received on one of the address lines 29, or by connecting the source of load transistor 52 to a voltage source 53 to produce a logic "1" when the gate of load transistor 52 is active. When the gate of load transistor 52 becomes active by load signal 70, the programmed logic, or voltage level is passed to the gate of input transistor 54. After transistor 52 turns off, the passed voltage level will remain stored in the parasitic gate capacitance of input transistor 54. Because the voltage at the gate of input transistor 54 will eventually discharge due to leakage currents, the voltage is considered dynamically stored on the gate.

With the input 78 loaded with the programmed voltage level, it can now be shifted to the output 76. This is accomplished by sequential clock signals transmitted by the printer electronics 22 and received by the shift register 50. A clock 1 input is received on line 72 and a clock 2 input is received on line 74, where each clock input 72, 74 is received from the printer electronics 22 via a separate address line 29. A voltage pulse on the clock 1 input 72 passes the logical inverse from the gate of input transistor 54 to the gate of output transistor 60. When the clock 1 input 72 is active, load transistor 56 turns on as does pass transistor 58. If the input 78 of the shift register 50 is a logic "1", input transistor 54 will turn on and the gate of output transistor 60 will discharge. If the input 78 of the shift register 50 is a logic "0", input transistor 54 will remain off and the gate of output transistor 60 will be discharged through load transistor 56 and pass transistor 58. When the voltage pulse on the clock 1 input 72 goes inactive, pass transistor 58 turns off and the voltage level (i.e., the logic inverse of the voltage level that was parasitically stored on the gate of input transistor 54) will be dynamically stored on the gate of output transistor 60.

A voltage pulse on the clock 2 input 74 passes the logic inverse from the gate of output transistor 60 to the output 76 of the shift register. When the clock 2 pulse is active, load transistor 62 turns on as does pass transistor 64. The logic inverse of the gate voltage on output transistor 60 passes to the output 76 of the shift register. Therefore, after successive pulses on the clock 1 and 2 inputs 72, 74, the logic level on input 78 is passed to the output 76 as a single bit.

It should be noted that, because the load transistors 52, 56, 62 are off at all times except during clock pulses, the register 50 of FIG. 2 consumes little power.

Figure 3:
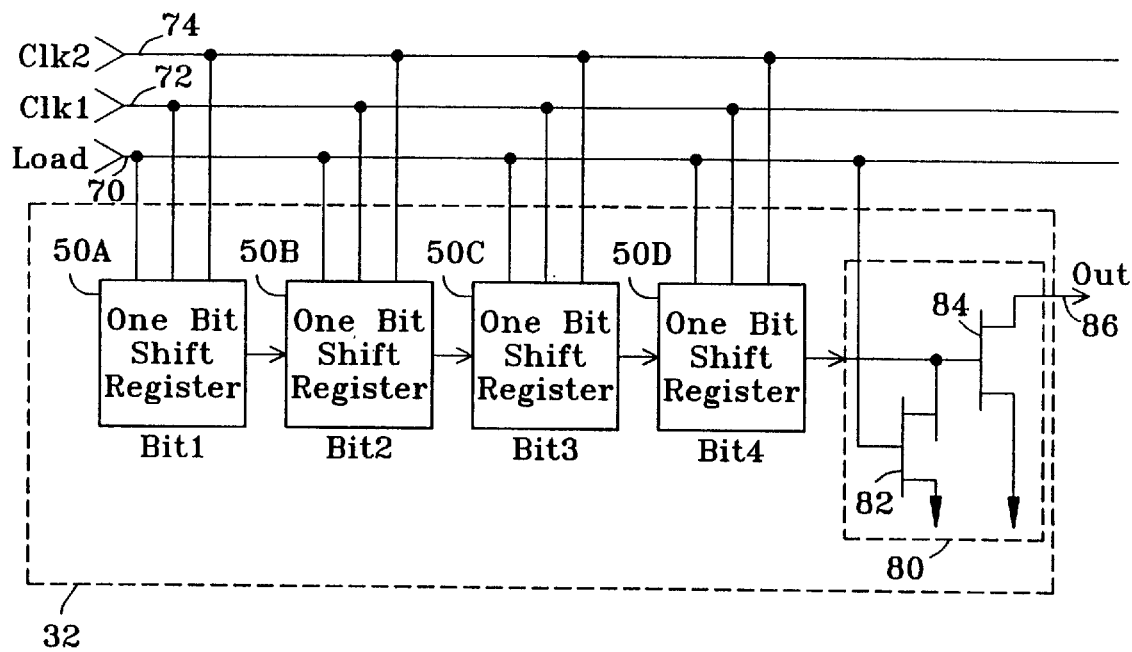
FIG. 3 is a block diagram of a four bit, parallel in, serial out identification circuit.

In a preferred embodiment, several shift registers 50 are connected in series to provide a digital code, such as the four bit example shown in FIG. 3. A voltage pulse on load signal 70 initiates a parallel load of the encoded logic level, or bit encoded within each of the four shift registers 50A–D. As previously discussed, this results in the programmed logic level being dynamically stored at the input 78 (FIG. 2) of each shift register 50A–D. A pulse on the clock 1 input 72 followed by a pulse on the clock 2 input 74 shifts the logic level from each register input 78 to each register output 76 so that each register output 76 is dynamically stored on the input 78 of the next register.

With each clock 1 and clock 2 sequence of pulses, each programmed bit is successively and serially shifted to an output device 80 and read by the controller 26 until all bits have been read by the controller 26. The controller 26 is programmed to interpret the code and determine the print head identifying information and reconfigure print control algorithms accordingly. In this manner, a single ink jet printer is able to accommodate many different type of print heads.

Figure 4:
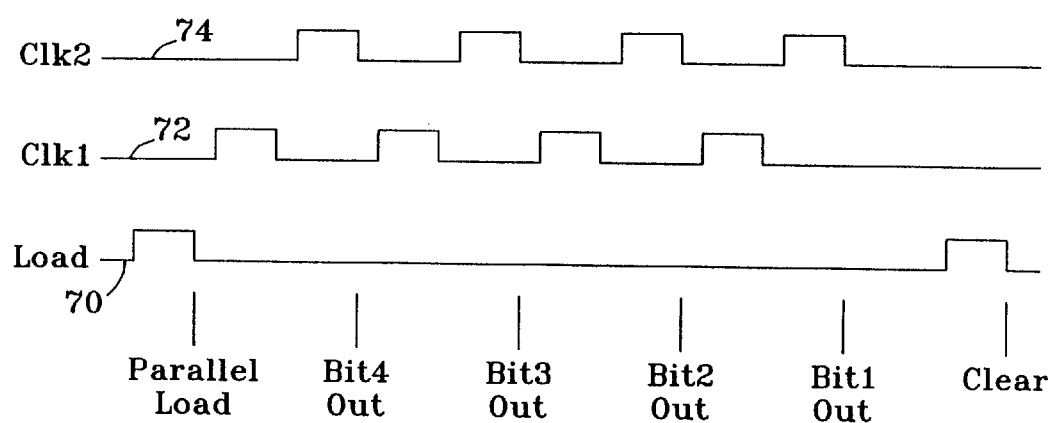
FIG. 4 is a timing chart for the circuit of FIG. 3.

As shown in FIG. 3, the output device 80 preferably includes an open drain output transistor 84 and a discharge transistor 82. The voltage level at the drain of output transistor 84 is pulled up on line 86 through a load device (not shown) within the printer electronics 22 (FIG. 1) so that the printer controller 26 reads a programmed logic level after each clock 2 pulse. For example, when a clock 2 pulse causes a programmed logic level "1" to be transmitted to the gate of output transistor 84, output transistor 84 will become active and the drain will be pulled down. The controller 26 detects the lowered voltage level at the drain by reading the voltage level at line 86 and thereby senses that a logic level "1" has been transmitted by the ID circuit 32. Similarly, with each successive clock 2 pulse the programmed logic levels of the shift registers 50A–D are sequentially shifted and serially transmitted to output transistor 84 to be read by the controller 26. FIG. 4 is a timing chart for serial transmission of four bits of encoded information by the ID circuit 32 of FIG. 3.

With continued reference to FIG. 3, the open drain output 86 preferably utilizes an existing chip I/O line to serially transmit the encoded identifying information to the printer controller 26, such as the temperature sense output 35. Utilization of the existing temperature sense output 35, along with the fact that the encoded information is serially transmitted, eliminates the need for additional chip output lines. After all bits of the encoded information have been read, a pulse on the load signal line 70 activates discharge transistor 82 to discharge the gate of output transistor 84, thereby enabling valid temperature sense information to be transmitted to the controller 26 immediately after the gate of output transistor 84 has been discharged. To prevent possible interference with normal operation of the temperature sense circuit 34, a pulse is output by the controller 26 on the load signal line 70 prior to each read of the temperature sense circuit 34. This ensures that the gate of output transistor 84 remains discharged during temperature control operations.

The controller 26 reads the serial digital output on line 86 and determines print head identifying information by comparing the received bit pattern against stored correlations of print head information. With the print head properly identified by the printer controller 26, the controller 26 is now able to reconfigure its control system algorithms to accommodate printing with the installed print head.

It will be understood that any number of shift registers 50 may be employed in the present invention without increasing the required number of address lines 29. Therefore, there is disclosed an ink jet print head identification circuit 32 for serially transmitting to the printer controller 26 a digital code containing print head identifying information where the number of bits comprising the digital code is independent of the total number of address lines 29 available.

Figure 5:
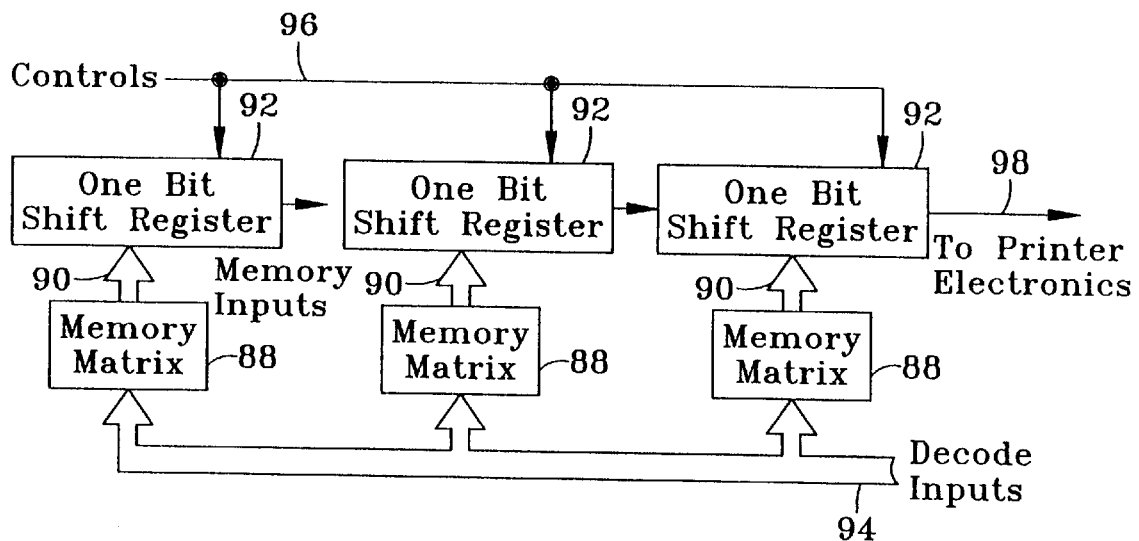
FIG. 5 is a block diagram of a three bit parallel in, serial out identification circuit with memory matrix inputs.

Referring now to FIG. 5, a print head identification circuit is shown that has decode memory matrices 88 electrically connected to the memory inputs 90 of one bit shift registers 92. The memory matrices 88 receive a decode signal function as an input. The decode signal function sent to the decode inputs 94 of the memory matrices 88 preferably consists of a series of predetermined digital words. These digital words prompt the memory matrices 88 to each output one bit of information. The bit of information is sent to the memory inputs 90 of the one bit serial registers 92. When the one bit shift registers 92 receive a control signal 96 from the printer electronics, the bit of information provided by the memory matrices 88 is loaded into the corresponding one bit shift register 92. The one bit shift registers 92 then serially transmit the information bits on an output line 98 to the printer electronics. The printer electronics then send the next word of the decode signal function to the memory matrices 88. Another set of information bits is sent to the printer electronics by the print head identification circuit in response to receiving the second word of the decode signal function at the decode inputs 94 of the memory matrices 88. The process is repeated until all the print head identification information is received by the printer electronics.

It should be appreciated that one three bit shift register could be used in place of the three one bit shift registers 92 depicted in FIG. 5. However, as previously stated, space on a print head cartridge is limited and, thus, the smaller the components used the better. Additionally, as also stated above, most print head cartridges are designed to be disposable. Therefore, it is particularly desirable that the print head identification circuit shown in FIG. 5 be constructed as inexpensively as possible.

Figure 6:
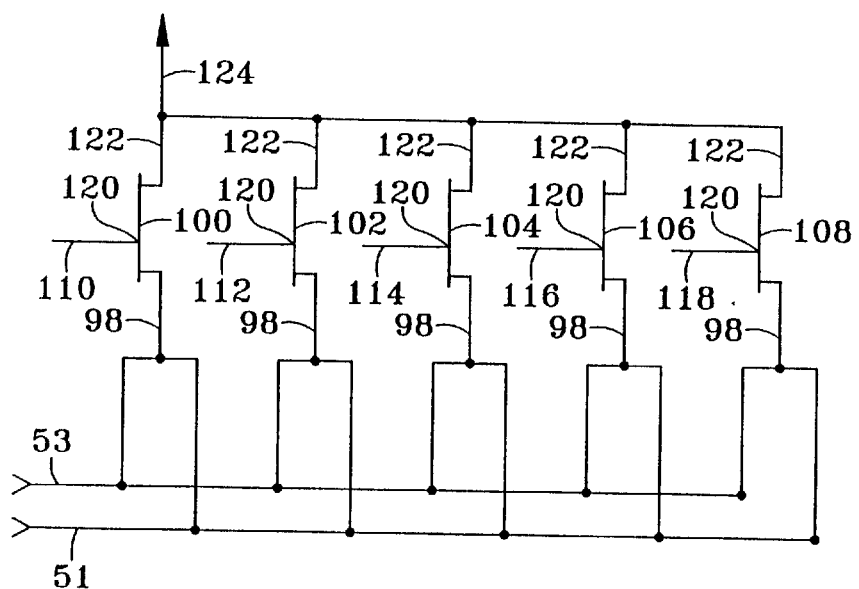
FIG. 6 is a circuit diagram of a one level decode memory matrix.

FIG. 6 is a circuit diagram of a one level decode memory matrix of the present invention. The one level decode memory matrix shown in FIG. 6 stores five bits of information. These bits of information are stored by connecting the drains 98 of five transistors 100, 102, 104, 106 and 108 to either Vdd 53, a voltage potential representing a logic "1", or Gnd 51, a voltage potential representing a logic "0". The one level decode memory matrix receives the decode signal on five print head address lines 110, 112, 114, 116, and 118. For the one level decode memory matrix shown in FIG. 6, the decode signal function will consist of a series of five digital words with five digits contained in each word. The print head information output from this one memory matrix will be five information bits, one in response to each word of the decode signal function.

The decode signal function for a one level memory matrix should only have one active, or logical one, bit per word. For example, the first word could be "10000". Thus, the print head address line connected to the gate 120 of transistor 100 would contain a one and the print head address lines connected to the gates 120 of transistors 102, 104, 106 and 108 would contain a logic zero. Applying a logic one to the gate 120 of transistor 100 causes the voltage at its drain 98 to pass to its source 48. Thus, if the drain 98 of transistor 100 is connected to a logical one, a logical one will be passed to the source 122 of transistor 100 and to the shift register memory input 124. Similarly, sending the digital word "01000" on address lines 110, 112, 114, 116 and 118 respectively would result in the voltage on the drain 98 of transistor 102 being passed to the source of transistor 102 and the shift register memory input 124. By sending a series of digital words containing a single logical one, the printer electronics can read all five bits contained in the single level memory matrix shown in FIG. 6.

The digital words of the decode signal function for a single level should only contain one logical one. If the digital word "11000" was sent to the single level memory matrix shown in FIG. 6 on address lines 110, 112, 114, 116 and 118 respectively, the voltage from the drains 98 of both transistors 100 and 102 would be passed to their sources 122 and the shift register memory input 124. If the voltage on the drains 98 of the transistors 100 and 102 was different, the output received at the shift register memory input 124 would be uncertain. In fact, if precautions were not taken, a short circuit could result that might damage the memory matrix.

The discussion of FIG. 6 was focused on the use of transistors. However, it should be understood that transistors electrically connected in the manner contemplated in the present invention function as simple electronic switches. As previously discussed, the source and drain of a transistor are connected by a low resistance current path when a sufficiently high voltage is applied to the gate. While the term transistor is used throughout the application, there are many different types of electronic switches that could be used to construct the present invention. For example, field effect transistors, metal-oxide semiconductor field effect transistors, junction field-effect transistors, bipolar-junction transistors, and any other device that functions as an electronic switch could be used in place of the generic transistors discussed.

FIG. 7a shows a two level memory matrix that uses five address lines to decode the memory. For simplicity's sake, a connection to one of the five address lines 110, 112, 114, 116, and 118 is denoted by placing the number of the address line 110, 112, 114, 116 or 118 in the box representing the transistor as shown in FIG. 7b. The first level 128 of the two level memory matrix consists of ten transistors with their drains 98 connected to Vdd 53 or Gnd 51 depending upon the particular information to be encoded. The gates 120 of transistors 132, 134, 136, 138 are connected to address lines 112, 114, 116 and 118 respectively. The sources 122 of transistors 132, 134, 136, and 138 are electrically connected to the drain 98 of transistor 140. Transistor 140 has its gate electrically connected to address line 110. The source 122 of transistor 140 is electrically connected to the shift register memory input 124. Therefore, to pass the voltage on the drain 98 of one of the transistors 132, 134, 136, and 138 to the shift register memory input 124, a logic one must be sent to the gate 120 of transistor 140 on address line 110 and a logic one must be sent to the gate 120 of either transistor 132, 134, 136, or 138 on address line 112, 114, 116, or 118 respectively. For example, if the digital word "11000" is sent on address lines 110, 112, 114, 116 and 118 respectively, the gates of transistors 132 and 140 will be opened. Thus, the voltage on the drain 98 of transistor 132 will be passed to the source 122 of transistor 132 and the drain 98 of transistor 140. Because the gate 120 of transistor 140 is open, the voltage on the drain 98 of transistor 140 will be passed to the source 122 of transistor 140 and the shift register memory input 124. Thus, the information bit encoded on the drain 98 of transistor 140 will be sent to the shift register memory input 124 in response to the printer electronics sending the digital word "11000" on address lines 110, 112, 114, 116 and 118 respectively. In a similar manner to that described above, sending the digital word "10100" will cause the information bit encoded on the drain of transistor 134 to be sent the shift register memory input 124. Thus, by sending a decode signal function consisting of the digital words "11000", "10100", "10010" and "10001", the print electronics can select the information bits encoded on transistors 132, 134, 136 and 138.

The same process would be repeated for transistors 142, 144 and 146. The drains 98 of the transistors 142, 144 and 146 are electrically connected to a voltage potential representing a logic one or a logic zero. The sources of the transistors 142, 144 and 146 are connected to the drain 98 of transistor 148. The gates 120 of transistors 142, 144 and 146 are electrically connected to address lines 114, 116, and 118. The gate 120 of transistor 148 is connected to address line 112. If the digital word "11000" is transmitted on address lines 110, 112, 114, 116 and 118, the gate of transistor 148 will be opened. However, the gates 120 of transistors 142, 144 and 146 would be closed and as a result no current path to the drain 98 of transistor 148 would be created through transistors 142, 144 and 146. Thus, the voltage on the source 122 of transistor 148 would come from some other source, namely, through transistors 132 and 140 as described in more detail above. If the digital word "01100" is sent by the printer electronics to the two level memory matrix shown in FIG. 7a on address lines 110, 112, 114, 116 and 118, the gates 120 of transistors 142 and 148 will be open. Thus, the voltage potential on the drain 98 of transistor 142 will pass to the drain 98 of transistor 148 and the voltage on the drain 98 of transistor 148 will pass to the shift register memory input 124. Likewise, sending digital word "01010" would send the information bit encoded on the drain 98 of transistor 144 and "01001" would send the information bit from transistor 146.

Electrical connections similar to those described above are used to connect transistors 150, 152 and 154. Sending the digital word "00110" will open the gates 120 of transistors 150 and 154 and load the information bit encoded on the drain 98 of transistor 150. The digital word "00101" will load the bit from transistor 152. Finally, transistors 156 and 158 are electrically connected so that the word "00011" will load the information bit from the drain of transistor 156.

The decode signal function needed to decode a two level memory matrix with five address lines as decode inputs built in accordance with the present invention would consist of all the possible different arrangements of two logical ones in a five bit digital word, i.e. "11000", "10100", "10010", "10001", "01100", 01010, "01001", "100110", "00101" and "00011". Thus, five address lines and fourteen transistors can encode ten bits of data in accordance with the present invention.

A three level memory matrix with five address lines built in accordance with the present invention would encode information bits that would be sent to shift register memory input 124 in response to all combinations of three logical ones in a five bit digital word, i.e. "11100", "11010", "11001", "10110", "10101", "10011", "01110", "01101", "01011", and "00111". The three level matrix would store ten bits of information. This is the same amount as the two level matrix with five address lines discussed above. However, a three level decode memory matrix using five address lines would require nineteen transistors to implement, five more than a two level five address line memory matrix. FIG. 8 shows a three level decode memory matrix using five address lines 110, 112, 114, 116 and 118. As in FIG. 7a, a box with a number in it represents a transistor with the address line represented by the number electrically connected to its gate 120, as show in FIG. 7b. In a manner similar to that previously discussed for a one level decode matrix and a two level decode matrix, sending "11100" on address lines 110, 112, 114, 116 and 118 respectively will cause the voltage potential on the drain 98 of transistor 160 to pass to the shift register memory input 124. Also similar to above discussed matrices, sending a digital word with more active bits than the levels of decode, such as "11110" for the three level decode matrix of FIG. 8, may cause a short circuit or uncertain output. In FIG. 8, "11110" would create a current path from the shift register memory input 124 to the voltage potentials 51 and 53 through transistors 160, 162 and 164, transistors 166, 162 and 164, and transistors 170, 168 and 164. Thus, the memory matrix is preferably constructed so that it never receives a word with too many active bits, or at least is not damaged by receiving a word with too many active bits.

As previously discussed, the number of bits capable of being stored by a particularly preferred embodiment of the present invention is given by the equation:

$$\frac{D!}{L!(D-L)!}$$

Where D represents the number of lines available for addressing the memory matrix and L represents the number of levels in the memory matrix. Since D will usually be a known value for a given application such as a print head identification circuit and the number of bits of memory required is also usually known the minimum number of levels needed can usually be calculated. In addition, the number of transistors need to construct a preferred embodiment of the present invention can be calculated by the equation:

$$\frac{D!}{(L-1)!(D-L+1)} + \frac{D!}{L!(D-L)!} - 1$$

Where D still represents the number of address lines and L represents the number of levels. If several levels will provide enough data bits for a given application, the above equation can be used to calculate the number of transistors required for each of the possible levels. By selecting the number of levels that provides the needed amount of memory and requires the smallest number of transistors to construct, the number of transistors needed can be minimized and the memory bit to transistor ratio can be maximized.

It is contemplated, and will be apparent to those skilled in the art from the foregoing specification and drawings that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A memory device for storing and outputting information comprising:

a plurality of memory matrices, each memory matrix containing a plurality of transistors having a drain, a source, and a gate and the plurality of transistors are arranged in a plurality of levels that proceed from a lowest level to a highest level;

a plurality of single bit shift registers for producing a serial output, each shift register having a memory input and an associated memory matrix, wherein the memory input of each shift register is electrically connected to the sources of the transistors in the highest level of the shift register's associated memory matrix;

a plurality of address lines for receiving a decode signal function, a load signal, and a clock signal; and an output line for transmitting the serial output of the plurality of shift registers.

2. The device of claim 1 wherein the gate of each one of the plurality of transistors is connected to one of the plurality of address lines.

3. The device of claim 1 where the drains of the transistors of the lowest level are either connected to a voltage potential representing a logic one or a voltage potential representing a logic zero and the sources of the transistors of the lowest level are connected to the drains of the transistors of the next highest level.

4. The device of claim 1 wherein the transistors of a level having a level immediately above the level and a level immediately below the level have their sources connected to the drains of the transistors of the level immediately above their level and their drains connected to the sources of the level immediately below their level.

* * * * *